United States Patent [19]

Boll

[11] 3,825,771

[45] July 23, 1974

[54] IGFET INVERTER CIRCUIT

[75] Inventor: Harry Joseph Boll, Berkeley Heights, N.J.

[73] Assignee: Bell Telephone Laboratories Incorporated, Murray Hill, N.J.

[22] Filed: Dec. 4, 1972

[21] Appl. No.: 311,482

[52] U.S. Cl. .................................. 307/214, 307/205

[51] Int. Cl. .......................................... H03k 19/08

[58] Field of Search..................... 307/304, 205, 214

[56] References Cited

UNITED STATES PATENTS

| | | | |
|---|---|---|---|
| 3,480,796 | 11/1969 | Polkinghorn | 307/205 |
| 3,497,715 | 2/1970 | Yen | 307/205 |
| 3,577,005 | 5/1971 | Cristensen | 307/205 |
| 3,649,843 | 3/1972 | Redwine | 307/214 |
| 3,676,709 | 7/1972 | Ducamus | 307/205 |
| 3,683,201 | 8/1972 | Haraszyi | 307/205 |
| 3,706,889 | 12/1972 | Rapp | 307/205 |
| 3,710,271 | 1/1973 | Putman | 307/205 |
| 3,755,689 | 8/1973 | Elmer | 307/205 |

*Primary Examiner*—John S. Heyman
*Attorney, Agent, or Firm*—H. Christoffersen; Henry I. Schanzer

[57] ABSTRACT

A semiconductor inverter circuit consists of a driver, a load, and two other IGFETs. One of the two IGFETs is wired as a diode that is connected to the gate of the load IGFET. The drain of the other IGFET is also connected to the gate of the load IGFET. The source and drain of the load and diver are connected together and serve as the output terminal of the circuit. The gate of the diver serves as the input terminal. The IGFET connected as a diode serves to hold the load on while the output signal drops from a high to a low state. This significantly decreases the time necessary to achieve this change of state as compared to the case in which the load turns off. The fourth IGFET serves to turn off the load when the output signal is to assume the high state.

13 Claims, 9 Drawing Figures

IGFET INVERTER CIRCUIT

This invention relates to inverter circuits and, more specifically, to inverter circuits using field effect transistors.

A well-known and utilized inverter circuit comprises a p-channel field effect driver transistor and a p-channel field effect load transistor. The source of the load transistor and the drain of the driver transistor are coupled together and serve as the output terminal; the gate of the driver transistor serves as the input terminal. One serious problem associated with this inverter circuit is that when the output is switched to the low state, the driver transistor turns off, and as the output voltage decreases to the low level, the gate-to-source voltage of the load transistor is decreased. This causes the load transistor to start to turn off thereby lowering the transconductance of the load transistor. Consequently the equivalent resistance of the load transistor increases until theoretically it reaches an infinite value when the load transistor is turned off. This increase in the equivalent resistance drastically increases the response time of the output waveform.

One solution to the above problem is to increase the physical geometry of the load transistor, thereby decreasing the characteristic resistance and lowering the effective output time constant. This is achieved at the expense of additional power dissipation and lowering of the output voltage when both the driver and load transistors are on.

It would be very desirable to have available an inverter circuit that uses only field effect transistors and in which the response time of the output signal is not a function of the output voltage and the power-delay product is superior to the above described inverter.

OBJECTS OF THE INVENTION

Accordingly, it is an object of this invention to provide an inverter circuit which comprises only field effect transistors and which has improved delay and power characteristics.

SUMMARY OF THE INVENTION

This and other objects of the invention are attained in an illustrated embodiment of the invention which comprises a first insulated gate field effect transistor (IGFET) which serves as a driver transistor, a second IGFET transistor which serves as a load transistor, and three other IGFET transistors. The drain of the first IGFET (the driver transistor) is coupled to the source of the second IGFET (the load transistor). The gate of the driver transistor serves as the input terminal. The common node of the driver and load transistors serves as the output terminal.

The gate of the load transistor is coupled to the source of the third IGFET and the drain of the fourth IGFET. The source of the fourth IGFET is coupled to the drain of the fifth IGFET. The gate and drain of the third IGFET are coupled to a terminal which is held at a fixed potential. The gate of the fourth IGFET and the drain of the load IGFET are coupled to a terminal which is connected to a voltage pulse circuit. The source of the first and fifth IGFET are connected to a fixed potential.

In standby operation the load transistor is held on by the third transistor which is connected as a diode. Since the load transistor is on, the output of the circuit is at the potential applied to the drain of the load transistor. There is no sustained conduction during standby operation and, therefore, power dissipation is very low.

In the active condition the potential applied to the drain of the load transistor is decreased from the standby value. The output potential initially decreases in response to the drop in the potential of the drain since the second transistor is on. The final voltage excursion of the output depends upon the potential of the input. If the input is positive, the first and fifth transistors are off and the output quickly charges through the second transistor to the potential applied to the drain of the second transistor. This charging process is aided by the parasitic capacitances associated with the second transistor which cause the gate-to-drain potential of the second transistor to remain relatively constant as the output potential drops. After the initial transient the circuit dissipates no power.

If the input voltage is at or near ground potential, then the first, third, fourth and fifth transistors are on. This causes the potential of the gate of the second transistor to become positive and to turn off. This allows the output to raise in potential to the potential applied to the source of the first transistor.

In the preferred embodiment of the invention the fifth transistor is eliminated and the source of the fourth transistor is coupled to the drain of the first transistor. In addition, the gate and drain of the third transistor are coupled to a voltage pulse source instead of a fixed potential. This embodiment, besides containing fewer components than the previous one, has significantly lower power dissipation because there is no steady state conduction through the third and fourth transistors.

These and other objects, features and advantages of the invention will be better understood from a consideration of the following detailed description taken in conjunction with the following drawings.

BRIEF DESCRIPTION OF THE DRAWINGS

FIGS. 4, 5, and 6 are connected together;

DETAILED DESCRIPTION

Figure 1:
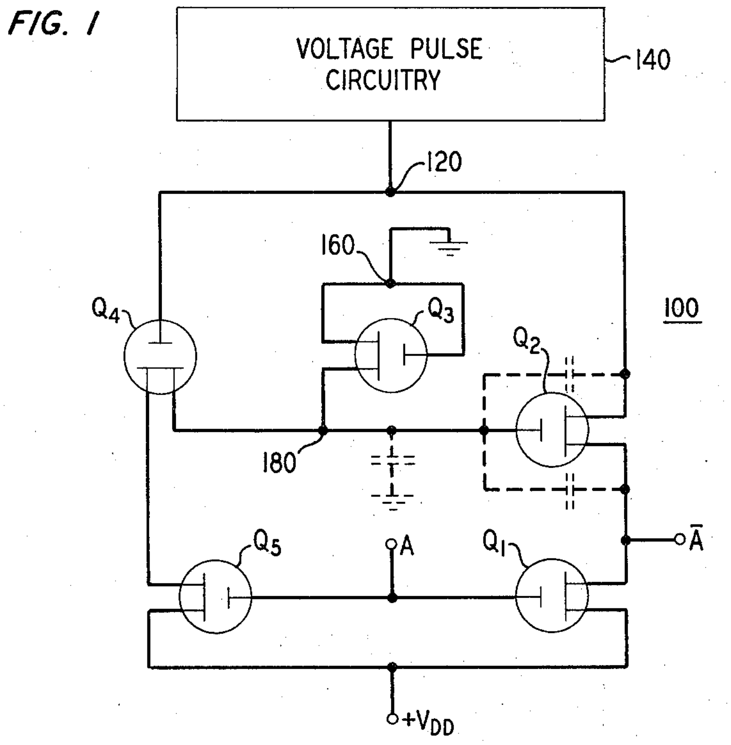
FIG. 1 illustrates one circuit embodiment of the present invention.

Referring now to FIG. 1, there is illustrated in schematic circuit form one embodiment of an inverter circuit 100. The drain of transistor $Q_1$ is coupled to the source of transistor $Q_2$. A terminal connected to this common node serves as the output terminal $\bar{A}$. The drain of transistor $Q_2$ and the gate of transistor $Q_4$ are coupled to node 120, to which is coupled a voltage pulse circuit 140. The gate of transistor $Q_2$ is coupled to the source of transistor $Q_3$ and the drain of transistor $Q_4$. The gate and drain of transistor $Q_3$ are coupled together to terminal 160. Terminal 160 is coupled to a reference potential, which is typically ground potential. The source of transistor $Q_4$ is connected to the drain of transistor $Q_5$. The gates of transistors $Q_1$ and $Q_5$ are common and a node connected to this common junction serves as input terminal A. The sources of transistors $Q_1$ and $Q_5$ are both returned to potential $+V_{DD}$, which is typically +10 volts. Transistors $Q_1$–$Q_5$ are all p-channel insulated field effect transistors.

The operation of the circuit of FIG. 1 is as follows:

Standby Condition

Voltage Pulse Circuit 140 hold node 120 at a positive potential which is typically +10 volts. $+V_{DD}$ is also typically +10 volts. $Q_4$ is off since the gate of $Q_4$ is held at +10 volts. The potential of node 180 (the gate of $Q_2$) is within one threshold voltage of ground potential since there can be no conduction through $Q_3$ because $Q_4$ is off (the gate of $Q_4$ is at +10 volts). This means that $Q_2$ is on (i.e., a channel exists between the source and drain of $Q_2$). $Q_1$ may be on or off, depending on whether the potential applied to node A is 0 volts or +10 volts, respectively. Independent of the potential of node A, there is no conduction within $Q_2$ and $Q_1$ since the drain of $Q_2$ and the source of $Q_1$ are both at +10 volts. The potential of output terminal $\bar{A}$ is +10 volts. This means that the power dissipation during standby is relatively low since only leakage current can flow. The potential applied to input terminal A is now set to 0 volts, or +10 volts, as is desired.

Active Condition

The potential applied to node 120 is pulsed from +10 volts to 0 volts. The fall time of this pulse is typically 10 nanoseconds. Due to parasitic capacitive coupling between the source, gate and drain of $Q_2$ it transiently stays on and node $\bar{A}$, which is at +10 volts, initially starts to follow the falling edge of the voltage pulse applied to terminal 120.

If input node A is at +10 volts, then $Q_1$ and $Q_5$ are off and, therefore, node 180 is at a potential of from 0 to +2 volts (the threshold potential of $Q_3$). Output node $\bar{A}$ can therefore discharge to 0 volts through $Q_2$ which is on. It is to be noted that due to the parasitic capacitive coupling between the gate and drain of $Q_2$, the potential of node 180 (the gate of $Q_2$) drops from approximately +2 volts to −2 volts as the potential of node 140 drops from +10 volts to 0 volts. This insures that $Q_2$ stays on as $\bar{A}$ drops in potential. The potential of the gate of $Q_2$ drops even below −2 volts, typically to −6 volts, since the drop in potential at $\bar{A}$ is capacitively coupled to the gate of $Q_2$ via the parasitic source to gate capacitance. The fact that $Q_2$ is kept completely on and that the gate-to-source potential is substantially maintained as the source drops from +10 volts to 0 volts, allows the output time constant and consequently the speed at which the $\bar{A}$ changes state to be relatively high.

If input A is at 0 volts then $Q_1$ and $Q_5$ are on. As has been discussed, when node 120 is pulsed to 0 volts, the potential of $\bar{A}$ starts to decrease towards 0 volts, but since conduction is rapidly established through $Q_3$, $Q_4$ and $Q_5$, node 180 rapidly rises in potential from +2 volts to +10 volts. This rise in potential of the gate of $Q_2$ causes $Q_2$ to rapidly turn off, thereby allowing $\bar{A}$ to recharge through $Q_1$ to $+V_{DD}$, which is +10 volts. Thus, $\bar{A}$ first begins to discharge toward 0 volts, but then quickly returns to +10 volts when $Q_2$ turns off.

The transient power is relatively high when $Q_2$ and $Q_3$ are on and conducting but typically the two are conducting only on for approximately 5 nanoseconds of a total typical cycle time of approximately 250 nanoseconds. A more serious power drain is that associated with the steady state current through $Q_3$, $Q_4$ and $Q_5$. This power consumption is much smaller than that of the standard inverter discussed in the background of the invention, wherein the load transistor must be of a relatively large geometry to charge $\bar{A}$ quickly. Here, $Q_1$ can be physically smaller because it need only charge the small gate capacitance of $Q_2$.

The proper operation of the circuit of FIG. 1 requires that A be set to a selected potential (0 volts or +10 volts) when node 120 is pulsed from +10 volts to 0 volts and that the potential of A be held fixed until node 120 is returned to +10 volts.

Recovery

The recovery time depends on the potential applied to A during the active part of the cycle. If A was at +10 volts, then $\bar{A}$ will be at 0 volts. When node 120 is brought to +10 volts, $\bar{A}$ can charge to +10 volts through $Q_2$. If A is at 0 volts, then $\bar{A}$ is at +10 volts. When node 120 is returned to +10 volts $\bar{A}$ is already essentially recovered (near +10 volts), but $Q_2$ is off. When $Q_4$ goes off, $Q_3$ can recharge the gate capacitance of $Q_2$ so that the circuit is ready for the next cycle. As soon as node 120 is increased in potential to +10 volts, the potential of A can be changed without adversely affecting the recovery.

The slowest switching time occurs when A is at +10 volts and node 120 is pulsed from +10 volts to 0 volts. With a 10 nanosecond fall time on the voltage pulse applied to node 120, $\bar{A}$ reach 90 percent of the final value in 50 nanoseconds. When A is at 0 volts and node 120 is pulsed from +10 volts to 0 volts, $\bar{A}$ starts out at +10 volts, decays to approximately +7.5 volts, and then recharges to +10 volts. One worst case test of this response is preformed by tieing A and node 120 together and then dropping the potential of node 120 from +10 volts to 0 volts in 10 nanoseconds. $\bar{A}$ first goes to +7.4 volts and then rapidly returned to +10 volts. The response time in this case is only approximately 30 nanoseconds.

As has been discussed, during the active part of the cycle when node 120 is at 0 volts and A is at 0 volts, steady state conduction occurs through $Q_3$, $Q_4$ and $Q_5$. The steady state power dissipation is typically only 1.2 milliwatts during this period.

A peak transient of power of 12 milliwatts results from current flow through $Q_1$ and $Q_2$ during the initial transient which typically lasts 5 nanoseconds. For a cycle time of 250 nanoseconds this works out to 12 milliwatts/250 nanoseconds of .24 milliwatts. The total power dissipation is therefore approximately 1.44 milliwatts (1.2mw + .24mw). This combined with the 50 nanosecond response time makes this inverter clearly superior to the standard inverter discussed in the background of the invention.

Figure 2:
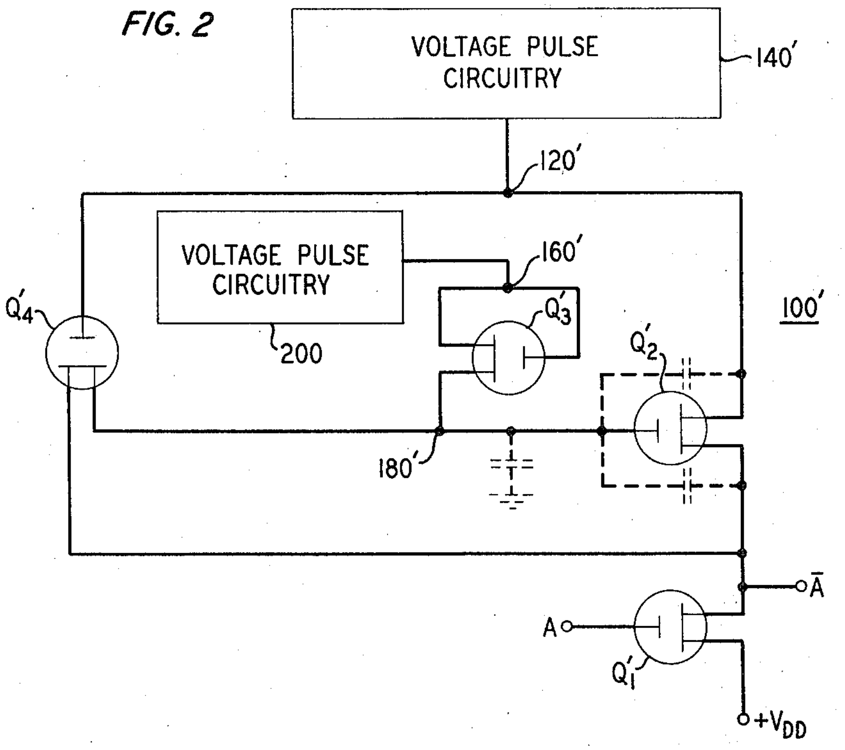
FIG. 2 illustrates another circuit embodiment of the invention.

Referring now to FIG. 2 there is illustrated a schematic of a preferred embodiment of the inverter 100′. The inverter of FIG. 2 is almost identical to that of FIG. 1 except that $Q_5$ has been removed and node 160′ (corresponding to node 160 of FIG. 1′) is coupled to a Voltage Pulse Circuit 200 instead of to a fixed potential (ground potential). The source of $Q'_4$ is coupled to the drain of $Q'_1$.

The circuit of FIG. 2 operates in a very similar manner as the circuit of FIG. 1.

Standby Condition

In the standby condition Voltage Pulse Circuitry 140′ holds node 120′ at a positive potential, which is typically +10 volts. The value of $+V_{DD}$ is typically +10 volts. Voltage Pulse Circuitry 200 holds node 160′ at ground potential. The potential of node 180′ is within one threshold voltage of ground potential since there can be no conduction through $Q'_3$ since $Q'_4$ is off (i.e., the gate of $Q'_4$ is at +10 volts). This means that $Q'_2$ is on. $Q'_1$ may on or off depending on whether A is at 0 volts or +10 volts. Independent of the potential of A, there is no conduction within $Q'_2$ and $Q'_1$ since the source of $Q'_1$ and the drain of $Q'_2$ are both at +10 volts. The potential of output terminal $\overline{A}$ is +10 volts. This means that power dissipation during standby is relatively low since only leakage current can flow. The potential applied to A is now set to 0 volts or +10 volts, as is desired.

Active Condition

The potential applied to node 120′ by Voltage Circuitry 140′; is pulsed from +10 volts to 0 volts. The potential applied to node 160′ by Voltage Pulse Circuitry 200 is pulsed from 0 volts to +10 volts. Initially $Q'_2$ stays on since the capacitance associated with node 180′ holds it at approximately +2 volts. This allows $\overline{A}$, which is a +10 volts, to initially follow the falling edge of the voltage pulse applied to the drain of $Q'_2$.

If input A is at +10 volts $Q'_1$ is off and node 180′ is at approximately +2 volts. $Q'_2$ is therefore in an on state and output $\overline{A}$ can therefore rapidly discharge to 0 volts through $Q'_2$. The potential of node 180′ (the gate $Q'_2$) drops from +2 volts to approximately −2 volts in response to the drop in the potential of node 120′ from +10 volts to 0 volts. This insures that $Q'_2$ stays on as $\overline{A}$ drops in potential. The potential of the gate of $Q'_2$ drops below −2 volts, typically to −6 volts, in response to the drop in potential of $\overline{A}$, which is coupled to the gate via the parasitic source to gate capacitance associated with $Q'_2$. The fact that $Q'_2$ is kept completely on and that the source to gate potential is substantially maintained, as source drops form +10 volts to 0 volts, keep the output time constant relatively low and consequently the speed at which $\overline{A}$ changes state is relatively high. If input A is at 0 volts than $Q'_1$ and $Q'_4$ are on. Since node 160′ is now at +10 volts there can be no steady state conduction through $Q'_1$, $Q_4$ and $Q'_3$. Transient conduction does occur through $Q'_1$ and $Q'_4$ until the parasictic capacitance associated with node 180′ is charged up to +10 volts. This +10 volts on the gate of $Q'_2$ cuts off $Q'_2$, thereby allowing $\overline{A}$ to recharge $Q'_1$ to $+V_{DD}$, which is +10 volts.

The transient power when $Q'_1$ and $Q'_2$ are on still exists as it does for the circuit of FIG. 1 but there is no standby state conduction as is true for the circuit of FIG. 1. The transient power when $Q'_1$ and $Q'_2$ are on is only .24mw. The only other substantial power dissipatance is the $CV^2$ power used to dive the capacitance of loads coupled to $\overline{A}$ (which are not illustrated). Assuming a 2pF loading and 10 volt operation leads to a power dissipation of $2\times10^{-12}\times10^{1}=2\times10^{-11}$ p joules. For a 250 nanosecond cycle this results in .5mw. The total dissipation is therefore only .74mw (.24 +.5). This added to the fact that the $\overline{A}$ can be switched within 50 nanoseconds, makes this inverter far superior to the standard field effect inverter described earlier.

Recovery

The time necessary for recovery and the mode of recover is very similar to that described earlier for operation of the inverter circuit of FIG. 1.

Figure 3:
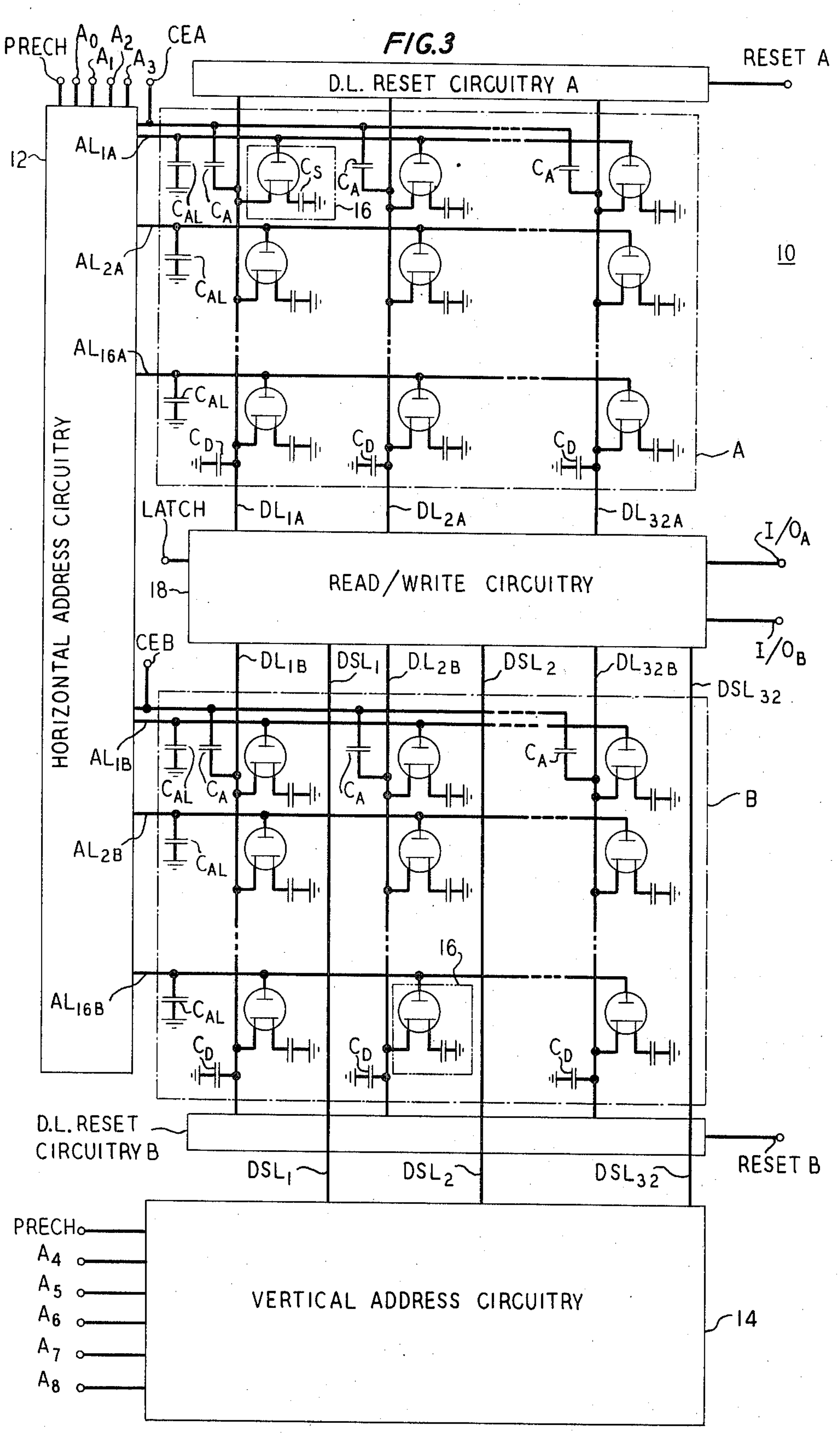
FIG. 3 illustrates in schematic and block form a complete memory system which utilizes the inverter circuit of FIG. 1 in the vertical and horizontal Access Circuitry.

Now referring to FIG. 3, there is illustrated a semiconductor memory array system 10 comprising horizontal address circuitry 12, vertical address circuitry 14, an A array of memory cells 16, a B array of memory cells 16, read/write circuitry 18, DL reset circuitry A and DL reset circuitry B.

The memory cells 16 of array A and array B are arranged in rows and columns which are denoted as access lines $AL_{1A-16A}$ and $AL_{1B-16B}$ and data lines 1A-16A, 1B-16B ($DL_{1A-16A,\ 1B-16B}$), respectively. $Al_{1A-16A,\ 1B-16B}$ are all coupled to the horizontal address circuitry 12 and $DL_{1A-16A,\ 1B-16B}$ are all coupled to read/write circuitry 18. Each of the data lines has a parasitic capacitance associated with it which is denoted as $C_D$. Each of the access lines has a parasitic capacitance associated with it which is denoted as $C_{AL}$.

The vertical address circuitry 14 is coupled to the read/write circuitry 18 through data select lines $_{1\text{-}32}$ ($DSL_{1\text{-}32}$). Input address signals are applied to the vertical address circuitry 14 through input terminals $A_4$, $A_5$, $A_6$, $A_7$ and $A_8$. Another terminal which is denoted as PRECH is also coupled to the vertical address circuitry 14. Terminals $I/O_A$ and $I/O_B$, which are coupled to the read/write circuitry 18, permit logic information to be written into or read out of any of the memory cells 16 of array A or array B. Another terminal denoted as LATCH, is also coupled to read/write circuits 18. Input signals are applied to the horizontal address circuitry 12 to terminals $A_0$, $A_1$, $A_2$, and $A_3$. Another terminal which is denoted as PRECH, is also coupled to the horizontal address circuitry 12.

DL reset circuitry A and DL reset circuitry B are coupled to the respective data lines of arrays A and B as is illustrated. An input terminal data to line reset circuitry A is denoted as reset A and an input terminal to data line reset circuitry B is denoted as reset terminal B.

A Chip Enable A (CEA) terminal is coupled to the horizontal address circuitry 12 and each of the 32 data lines of array A through 32 capacitors $C_A$. A Chip Enable B (CEB) terminal is coupled to the horizontal address circuitry 12 and to each of the 32 data lines of array B through 32 capacitors $C_A$.

The basic memory cell 16 comprises a field effect transistor with a capacitor $C_S$ coupled to the source. Arrays A and B each contains 16 access lines (AL) and 32 data lines (DL). The gate of each of the IGFETs of each memory cell is coupled to an access line and the drain is coupled to a data line. The $C_D$ associated with each data line is typically 0.8 pF.

The basic schematic and storage mode of the memory cells is well known. Basically the cell operates as follows:

If in a selected memory cell the gate potential (AL potential) is at +10 volts and the drain potential (DL potential) is at 0 volts, the IGFET is off and $C_S$ is isolated from DL. A channel is established between the drain and the source of the IGFET when the potential of the gate is returned to 0 volts. If the potential of $C_S$ is greater than the threshold potential of the IGFET (typically approximately 2 volts) then charge flows from $C_S$ into DL. This flow of charge, which is representative of a stored "1," can easily be detected by a conduction detector. If $C_S$ is substantially uncharged or charged to a point to equal to or less than the threshold voltage then no charge is transferred to the data line. This is representative of a stored "0" in the cell.

After the stored information in the cell is read out, the potential of $C_S$ is at approximately the threshold potential (approximately +2 volts). To rewrite a "1" into the cell, the DL is raised in potential to typically +10 volts and the AL is held at 0 volts. This allows $C_S$ to recharge to typically +10 volts, which is defined as a stored "1.") The AL potential is then increased to +10 volts thereby collapsing the channel created between the drain source and trapping the charge stored in $C_S$. A stored "0" need not be rewritten since the readout operation depletes the charge on $C_S$ thereby leaving the cell with a stored "0."

Figure 4:
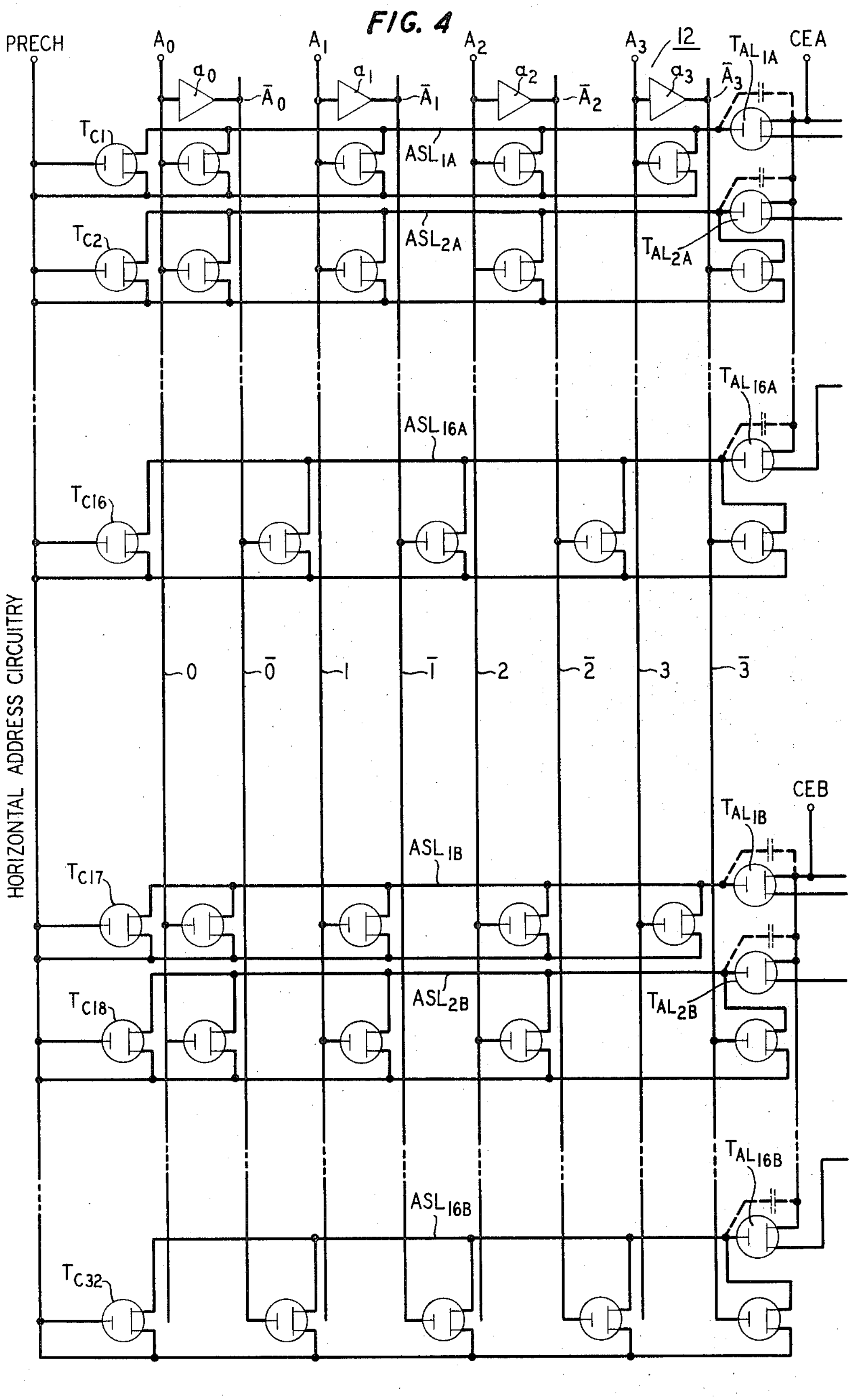
FIG. 4 illustrates the preferred embodiment of the horizontal address circuit of FIG. 3.

Referring now to FIG. 4 there is illustrated a preferred embodiment of the horizontal address circuitry 12 of FIG. 1. The input terminals are PRECH, $A_0$, $A_1$, $A_2$, $A_3$, CEA and CEB. The PRECH input terminal is coupled to the drain of each of the 32 IGFETs which are denoted as $T_{C_{1-32}}$. In each of these 32 IGFETs the gate is coupled to the drain such that each of the IGFETs effectively acts as a diode. The drain of each of the $T_C$ IGFETs is coupled to the drain of four other IGFETs in a common row. The source of each of $T_C$ IGFETs is coupled to the sources of the four other IGFETs of a common row. These common rows are denoted as access select lines $_{1A\text{-}16A\ and\ 1B\text{-}16B}$ ($ASL_{1A\text{-}16A\ and\ 1B\text{-}16B}$).

Input terminal $A_0$ is coupled to line 0 and to inverter $a_0$. The output of inverter $a_0$, node $\overline{A}_0$, is coupled to line $\overline{\mathbf{0}}$. Input terminal $A_1$ is coupled to line 1 and to inverter $a_1$. The output of inverter $a_1$, node $\overline{A}_1$, is coupled to line $\overline{\mathbf{1}}$. Input terminal $a_2$ is coupled to line 2 and to inverter $a_2$. The output of inverter $a_2$, node $\overline{A}_2$, is coupled to line $\overline{\mathbf{2}}$. Input terminal $A_3$ is coupled to inverter $a_3$. The output of inverter $a_3$, node $\overline{A}_3$, is coupled to line $\overline{\mathbf{3}}$. No two of the four IGFETs of a common row may be coupled to adjacent lines which receive complementary signals. For example, IGFETs are not coupled to lines 0 and $\overline{\mathbf{0}}$ of the first row, 2 and $\overline{\mathbf{2}}$ of the second row, or 3 and $\overline{\mathbf{3}}$ of any subsequent row. In addition, in access select lines 1A through 16A, none of the sets of four IGFETs occupy exactly the same position, as any other set of IGFETs. This is also true of access select lines 1B–16B. The position of the four IGFETs of $ASL_{1A}$ and $ASL_{1B}$ are, however, identical. The same is true for $ASL_{2A\text{-}16A}$ and $ASL_{2B\text{-}16B}$, respectively.

As is illustrated the access select lines are coupled to the gates of IGFETs $T_{AL_{1A\text{-}16A\ and\ 1B\text{-}16B}}$, respectively. The sources of all the $T_{AL_A}$ IGFETs are coupled to terminal CEA (Chip Enable A) and the sources of all of the $T_{AL_B}$ IGFETs are coupled to terminal CEB (Chip Enable B). The drain of $T_{AL_{1A}}$ is coupled to access line $AL_{1A}$ and the drains of $T_{AL_{2A\text{-}16A\ and\ 1B\text{-}16B}}$ are coupled to $AL_{2A\text{-}16A\ and\ 1B\text{-}16B}$, respectively. The source of each of $T_{AL}$ is coupled to the gate by a parasitic capacitance shown in dashed lines.

At the beginning of any read or write cycle, the PRECH terminal, which is held at 0 volts, is increased to +10 volts and either +10 volts or 0 volts is applied to terminals $A_0$, $A_1$, $A_2$, and $A_3$. During this time, CEA and CEB are both held at +10 volts. If +10 volts is applied to all the A inputs, then the four IGFETs of $ASL_{1A}$ are off and the potential of $ASL_{1A}$ is less than or equal to the threshold (approximately +2 volts). This means that the gate of $T_{AL_{1A}}$ is less than or equal to +2 volts. Since the source of $T_{AL_{1A}}$ (node CEA) is at +10 volts, conduction can occur through $T_{AL_{1A}}$ into $AL_{1A}$ until the parasitic capacitance associated with $AL_{1A}$ is charged to +10 volts. $T_{AL_{1B}}$ is also on since its gate is also at less than or equal to +2 volts and its source is at 10 volts. Therefore $AL_{1B}$ is also charged to +10 volts. The gates of all other $T_{AL_A}$ and $T_{AL_B}$ are at +10 volts since at least one of the four IGFETs of each of the ASL lines has a gate coupled to 0 volts which causes that IGFET to conduct. This causes all the nonselected access select lines to be at +10 volts. This in effect means that all the $T_{AL_{A\ and\ B}}$ transistors except $T_{AL_{1A}}$ and $T_{AL_{1B}}$ are off. All of the nonselected ALs are, however, at + 10 volts since prior to the application of the input signals to the horizontal address circuit 12 CEA and CEB were held at 10 volts and all the $T_{AL}$s were on for a period of time. After the appropriate input signals are applied to the horizontal address circuit 12 only $T_{AL_{1A\ and\ 1B}}$ are on.

Now CEA or CEB, depending on whether we want to read out information from a memory cell 16 of either the A array or B array, is lowered from +10 volts to 0 volts. If, for example, we wish to write into or readout of a cell of the A array, CEA would be lowered to 0 volts and not CEB. The parasitic capacitive coupling between the source and gate of $T_{AL_{1A}}$ causes the gate potential to follow the source potential and thereby keep $T_{AL_{1A}}$ on. This allows $AL_{1A}$ to be lowered in potential from +10 volts to 0 volts. Since the potential of all other gates of $T_{AL_{2A-16A}}$ is at +10 volts, none of them is on or will go on.

Figure 5:
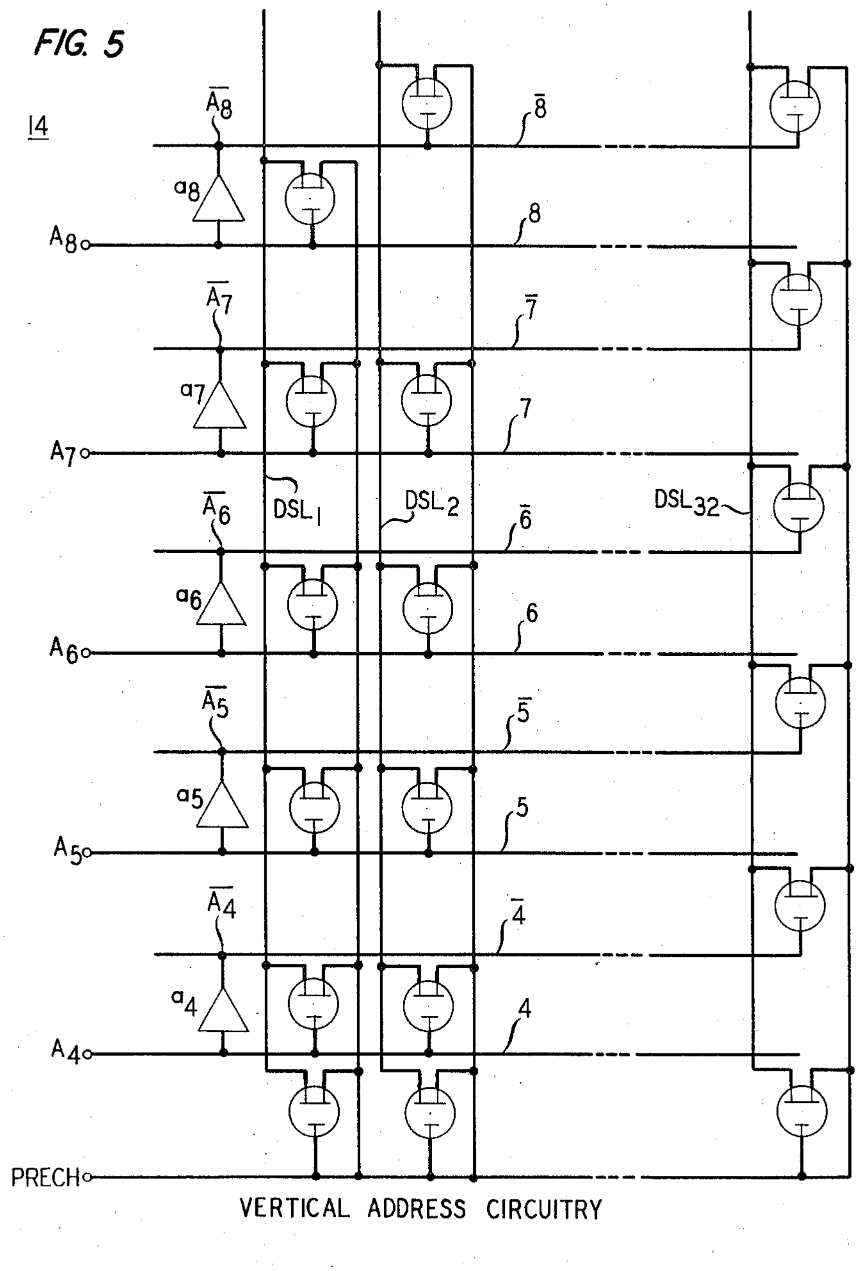
FIG. 5 illustrates the preferred embodiment of the vertical address circuit of FIG. 3.

Referring now to FIG. 5 there is illustrated a preferred embodiment of the vertical address circuitry 14 of FIG. 1. This select circuitry is very similar to that of the horizontal address circuitry 12 of FIG. 1 and performs the same type of function. The input terminals to this circuitry are PRECH, $A_4$, $A_5$, $A_6$, $A_7$ and $A_8$. There are five IGFET transistors per row. Sources of the five transistors of each common row are coupled to a data select line (DSL). Since there are 32 rows of five transistors each, there are correspondingly 32 DSL lines which are denoted as $DSL_{1\text{-}32}$. Each row contains an IGFET device, the gate and drain of which are coupled together and to the PRECH terminal and to the drains of the five transistors of that row. Each of the A inputs to the circuitry is coupled through an inverter. For example, $A_4$ is coupled to the input of inverter $a_4$ and likewise terminals $A_5$–$A_8$ are coupled to the inputs of inverters $a_5$–$a_8$. Line 4 is coupled to terminal $A_4$ and correspondingly lines 5–8 are coupled to terminals $A_5$–$A_8$. The output of inverters $a_4$–$a_8$ are denoted as nodes $\overline{A}_4$–$\overline{A}_8$. These nodes are coupled to lines $\overline{\mathbf{4}}$–$\overline{\mathbf{8}}$ respectively.

Eight of the inverter circuits 100 of FIG. 1 are used as the three inverters of the Horizontal Address Circuitry 12 and the five inverters of the Vertical Address Circuitry 14. The source of $Q_1$ and $Q_5$ are coupled to +10 volts and the drain of $Q_2$ is coupled to a terminal which receives the same waveform applied to the PRECH terminal but inverted (i.e., if PRECH is at +10 volts the drain of $Q_2$ is held at 0 volts and if PRECH is at 0 volts the drain of $Q_2$ is at +10 volts).

The PRECH terminal is first held at 0 volts and then increased in potential to +10 volts. At the same time either +10 volts or 0 volts is applied to each of the terminals $A_4$–$A_8$. If +10 volts is applied to input terminals $A_4$–$A_8$, then $DSL_1$ will be held at a potential less than or equal to the threshold voltage (+2 volts), while all other DSLs will each contain at least one IGFET which is on and causes these lines to be at +10 volts.

After input signals are supplied to the four A input terminals of the horizontal address circuitry 12 and five A input siganls are applied to the vertical address circuitry 14, two of the 32 access select lines are set to ≤+2 volts and one of the 32 DSL lines is also set to ≤+2 volts. The remaining 31 data select lines and 30 access select lines are set to +10 volts. After CEA or CEB is pulsed from +10 volts to 0 volts, only one of the 32 access lines is dropped in potential from +10 volts to 0 volts.

Figure 6:
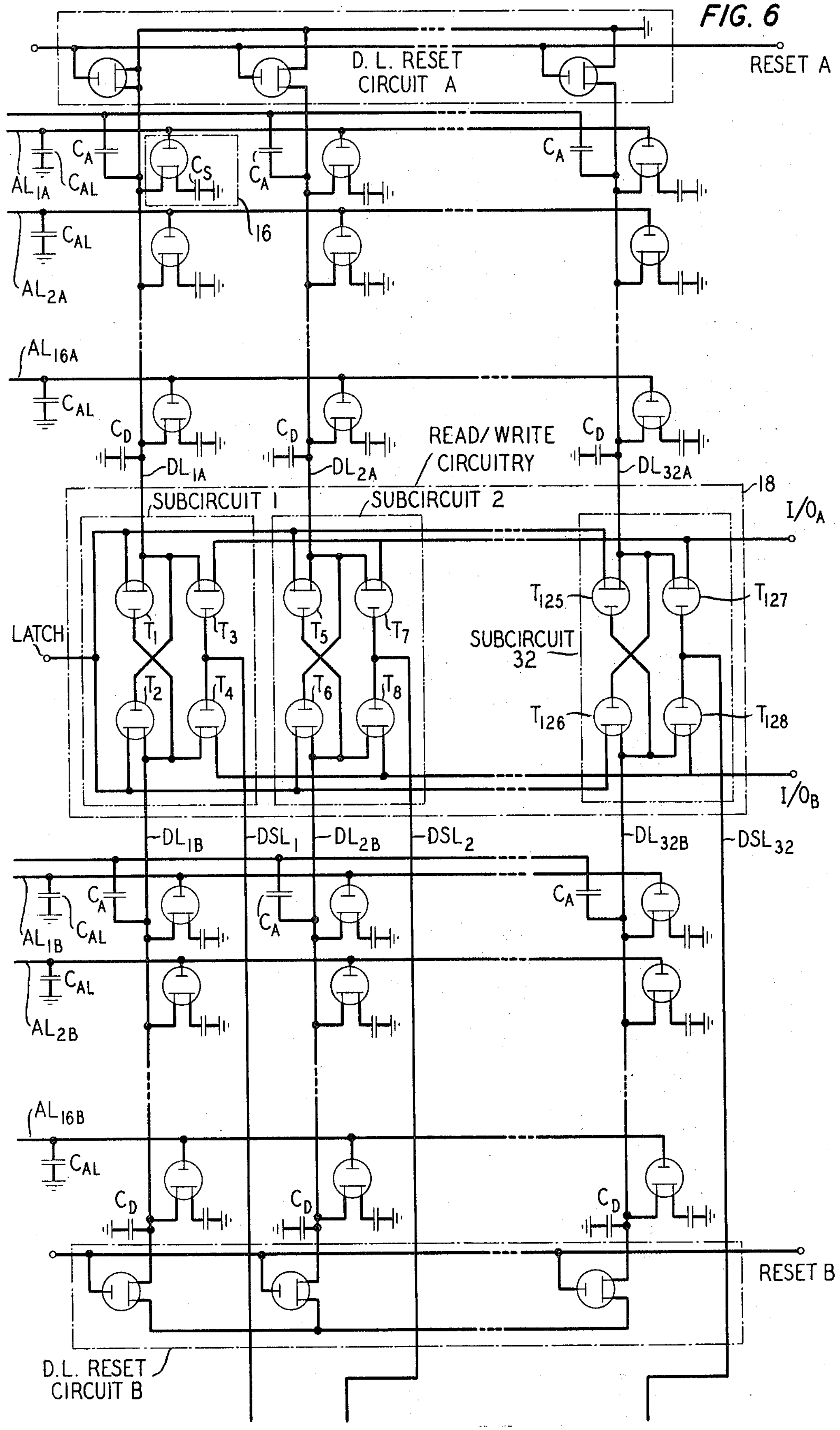
FIG. 6 illustrates the preferred embodiment of the DL Reset Circuitry and the read/write circuitry of FIG. 3.

Referring now to FIG. 6 there is illustrated the preferred embodiment of the DL Reset Circuitry A and B and the read/write circuitry 18. DL Reset Circuitry A and DL circuitry B each comprise 32 IGFETs, the drains of which are all common and coupled to 0 volts (ground potential). The gates of each of the 32 IGFETs of DL Reset Circuitry A are coupled to a terminal denoted as reset A and the gates of each of the 32 IGFETs of DL Reset Circuitry B are coupled to a terminal denoted as reset B. Reset Terminal A may be coupled to reset terminal B. The source of each of the 32 transistors of DL Reset Circuitry A is coupled to an individual DL of array A and the source of each of the 32 transistors of DL Reset Circuitry B is coupled to an individual DL of array B.

During the interval between read/write cycles, which will be explained in detail later, the gates of the 64 transistors of DL Reset Circuitry A and B are held at −5 volts. since all of the corresponding sources are held at 0 volts, all of the 64 transistors are on, thereby bringing the 64 DLs to 0 volts. During the read/write cycles the potential on the gates of the 64 transistors is increased to +5 volts. This turns off the 64 corresponding transistors, thereby allowing the 64 DLs to float in potential at initially 0 volts.

The preferred embodiment of the read/write circuitry 18 comprises 32 subcircuits, denoted as subcircuit 1–32, which each comprises four IGFETs. Referring now to subcircuit 1, the gate of $T_1$ is coupled to the drain of $T_2$, which is coupled to $DL_{1B}$ and the source of $T_3$. The gate of $T_2$ is coupled to the drain of $T_1$, which is coupled to $DL_{1A}$ and the source of $T_4$. The source of $T_1$ and $T_2$ are coupled to a common terminal denoted as LATCH. The gate of $T_3$ and the gate of $T_4$ are both coupled to $DSL_1$. The drain of $T_3$ is coupled to terminal $I/O_A$ (input/output A) and the drain of $T_4$ is coupled to terminal $I/O_B$ (input/output B). Transistors 1 and 2 form a cross-coupled flip-flop in which only transistor 1 or transistor 2 conducts at a given time.

Subcircuit 2 is identical to subcircuit 1 except that it is coupled to $DL_{2A}$, $DL_{2B}$ and $DSL_2$. The other 3 subcircuits are also identical to subcircuit 1 and are correspondingly connected to the appropriate lines and data select lines.

In order to write a "1" into the memory cell at location ($AL_{1A}$, $DL_{1A}$) the following procedure is followed:

+10 volts is applied to the PRECH terminals of the horizontal and vertical address circuitry 12 and 14 and +10 volts is applied to terminals $A_0$, $A_1$, $A_2$, $A_3$, CEA, CEB, $A_4$, $A_5$, $A_6$, $A_7$ and $A_8$. As has been discussed, this causes $ASL_{1A}$ and $ASL_{1B}$ and $DSL_1$ to assume a potential of approximately +2 volts and $ASL_{2A\text{-}16A}$ and $ASL_{2B\text{-}16B}$ and $DSL_{2\text{-}32}$ to assume the potential of +10 volts. At this point in time all the data lines, which were held at 0 volts, are allowed to float at ground since the potential applied to reset terminal A and B is positively pulsed from −5 volts to +5 volts. Now CEA is lowered in potential from +10 volts to 0 volts. As has been discussed, only $AL_{1A}$ drops to 0 volts and all other ALs stay at +10 volts.

When the potential of CEA drops by 10 volts the potential of $DL_{1A\text{-}16A}$, which were floating at ground potential, drops in potential to approximately −2 volts. The value of $C_A$ which couples terminal CEA to each of the data line of array A is such that the 10 volt drop at CEA causes a 2 volt drop on each of the data lines of array A. Typically, $C_A$ is .2 pF and $C_D$ is .8 pF. As will be seen later, if a selected cell contains a stored "1" ($C_s$ is charged to +10 volts) during the readout operation, the capacitance $C_D$ associated with $DL_{1A}$ increases in potential by 4 volts. The 10 volts pulse applied to $C_A$ causes the potential of $DL_A$ to drop by only 2 volts or 1/2 of the magnitude of the change that a cell storing a "1" would cause upon readout.

$I/O_A$ which is normally held at 0 volts is now pulsed to +10 volts. Since the gate of $T_3$ ($DSL_1$) is at +2 volts, and the source ($I/O_A$) is at +10 volts, $T_3$ is on and conducts such that its source, which is coupled to $DL_{1A}$, is increased in potential to +10 volts. This causes $DL_{1A}$ to increase in potential from −2 volts towards +10 volts. Since the gate potential of $T_1$ is at 0 volts (it is coupled to $DL_{1B}$ which is floating in potential at 0 volts) and the potential of $T_2$, which is coupled to $DL_{1A}$, is positive, $T_1$ is on (i.e., a channel is created between the drain and the source of $T_1$). At this point in time the potential applied to the LATCH node is increased from 0 volts to +10 volts. This causes conduction through $T_1$, thereby bringing the potential of $DL_{1A}$ to +10 volts. Since $AL_{1A}$ is at 0 volts, the selected memory cell transistor is on and the corresponding $C_S$ charges to +10 volts, which is indicative of a stored "1."

In order to write a "0" into the selected cell, the same procedure is followed as to write a "1" but $I/O_A$ is held at 0 volts and $I/O_B$, which was held at 0 volts, is now pulsed at +10 volts. Since the selected cell in which a "0" is to be written stores a "1," the charge stored on $C_S$ of the selected cell discharges into $DL_{1A}$ thereby increasing the potential of $DL_{1A}$ from −2 volts to +2 volts. Since the gate of $T_1$ is at +10 volts (transistor $T_4$ is on and conducts since the gate is at +2 volts and the source is at +10 volts) and the gate of $T_2$ is at approximately +2 volts (it is coupled to $DL_{1A}$ which is at +2 volts) $T_2$ is on and $T_1$ is off. The +10 volt pulse applied to the LATCH terminals causes conduction in $T_2$ but not $T_1$. This insures that the potential of $DL_{1A}$ does not go more positive than +2 volts, which is insufficient to rewrite a "1" into the selected cell. The capacitor $C_S$ of the selected cell therefore remains charged up to only the threshold voltage which is indicative of a stored "0." After a "1" or a "0" has been written in to the selected cell, $AL_{1A}$ is returned to +10 volts by returning CEA to +10 volts. This locks in either charged state in $C_S$. $DL_{1A}$ and all other DLs are returned to ground potential by DL Reset Circuitry A and B upon the application of +5 volts to the gates of DL Reset Circuitry A and B. In addition PRECH and LATCH are returned to 0 volts. This concludes the write cycle.

The same basic procedure used to write in information into the selected cells is used to read it out, except that $I/O_A$ and $I/O_B$ are both held at 0 volts during the entire read operation. If the selected cell contains a stored "1" $DL_{1A}$ is increased in potential from −2 volts to +2 volts. If the cell contains a stored "0" $DL_{1A}$ stays at −2 volts.

Assuming the cell contains a stored "1," the +2 volts on the gate of $T_2$, combined with the 0 volts on the gate of $T_1$, causes $T_1$ to be on and $T_2$ to be off. When the LATCH terminal potential is increased to +10 volts from ground potential, conduction occurs through $T_1$ and $T_3$ but not through $T_2$ and $T_4$. This conduction flows into terminal $I/O_A$ and is detected by conduction detector (not illustrated) coupled to node $I/O_A$. This conduction is indicative of the read out of a "1" from the selected cell. As $T_1$ conducts, $DL_{1A}$ is raised in potential to +10 volts, which allows $C_S$ of the selected cell to recharge to +10 volts (a stored "1"). This means that the read out operation refreshes the stored "1" and is therefore nondestructive. In the case that the cell contains a stored "0," the gate of $T_2$ is at −2 volts and the gate of $T_1$ is at 0 volts. This means that $T_2$ is on and $T_1$ is off. When the potential applied to the LATCH terminal is increased in ground potential to +10 volts, $T_2$ and $T_4$ conduct while $T_1$ and $T_3$ do not. The conduction through $T_2$ and $T_4$ into terminal $I/O_B$ is detected by conduction detector (not illustrated) coupled to terminal $I/O_B$. This current into terminal $I/O_B$ is indicative of a stored "0" in the cell. It is not necessary to rewrite a stored "0" since the discharge state of $C_S$ of the selected cell is defined as the "0" state.

As will be apparent, the read and write operations do not destroy information stored in any nonselected cell. It is apparent that all access lines other than $AL_{1A}$ are at +10 volts during the entire read/write cycle and therefore all information stored on the respective $C_S$s is trapped since all of the respective transistors are off. The only cells in which stored information could be destroyed are those coupled to the selected access line $AL_{1A}$.

If it is assumed that the cell located at $AL_{1A}$, $DL_{2A}$) stores a "1" and the cell located at ($AL_{1A}$, $DL_{32A}$) stores a "0," it is easily demonstrated that this information will not be destroyed during a read or a write cycle being performed on the selected cell.

During the read/write cycle, the potential of $DL_{2A}$ changes from −2 volts to +2 volts because of the storage of a "1" in location ($AL_{1A}$, $DL_{2A}$). The gate of $T_5$ is at 0 volts and the gate of $T_6$ is at +2 volts. This means that $T_5$ is on and $T_6$ is off. When the LATCH pulse is applied $T_5$ transiently conducts until $C_D$ associated with $DL_{2B}$ is charged to +10 volts. There can be no flow of current from the LATCH terminal through $T_5$ and $T_7$ since the gate of $T_7$ is at +10 volts ($DSL_2$ is nonselected and therefore held at +10 volts). $C_S$ associated with the memory cell located at $AL_{1A}$, $DL_{2B}$) charges back to +10 volts and thereby refreshes the stored "1."

During the read/write cycle $DL_{32A}$ goes to −2 volts, since the memory cell at location ($AL_{1A}$, $DL_{32A}$) contains a stored "0." As is apparent this condition causes transistor 126 to be on and 125 to be off. When the LATCH terminal is pulsed to +10 volts from 0 volts, transistor 126 transiently conducts and charges $DL_{32B}$ to +10 volts. However, transistor 125 does not conduct and data line $DL_{32A}$ remains at −2 volts. This in effect means that $C_S$ associated with the memory cell located at ($AL_{L1A}$, $D_{L32A}$) maintains a stored "0."

Any memory cell 16 of array A or B can have information written into or read out of by utilizing the same basic procedures illustrated for the memory located at ($A_{L1A}$, $D_{L32A}$) of arra A.

The preferred embodiment of the invention has been implemented in monolithic integrated circuit form. The actual integrated circuit chip is 155 mils by 110 mils, and contains 1,024 memory cells. Each of the memory cells occupies 4.9 square mils of semiconductor area and utilizes a p-channel IGFET.

Figure 7:
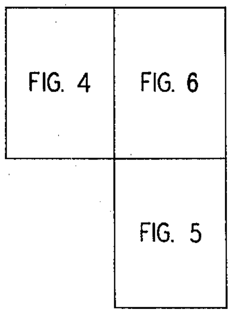
FIG. 7 illustrates how

FIG. 7 illustrates how the circuitry of FIGS. 2, 3 and 4 are coupled together.

Figure 8:
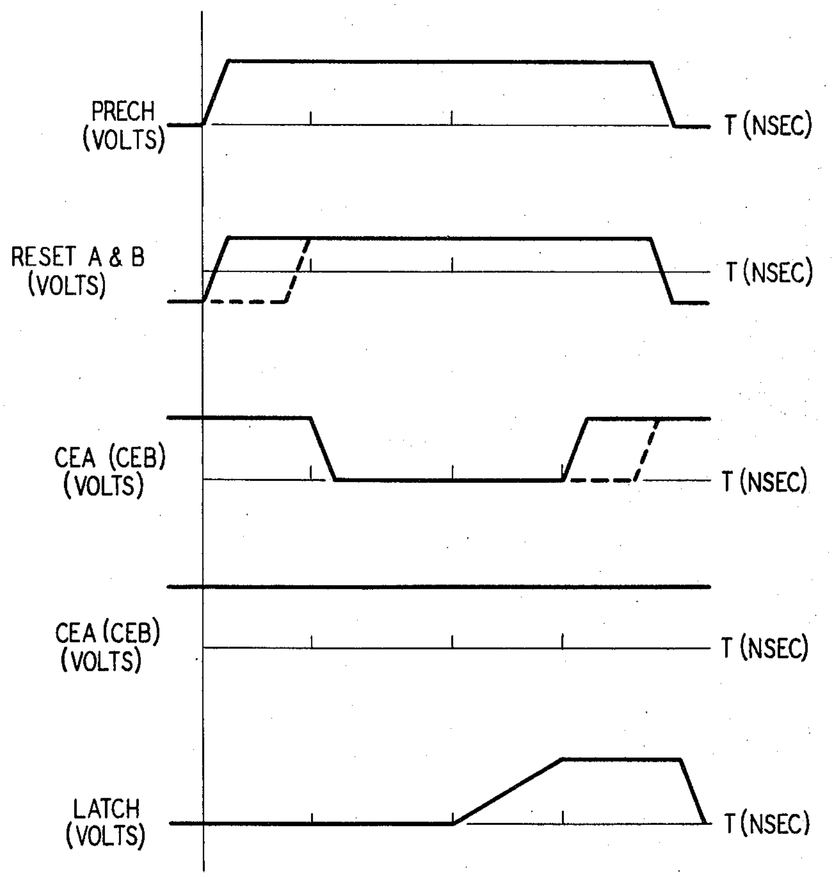
FIG. 8 graphically illustrates the timing of the basic read/write cycle utilized with the memory system of FIG. 3.

The basic timing cycle utilized may be more easily understood by reference to the graphs in FIG. 8 and the following description:

At $T = 0_+$ seconds, the input signals to $A_0$, $A_1$, $A_2$, $A_3$, $A_4$, $A_5$, $A_6$, $A_7$ and $A_8$ are assumed to be set to either 0 volts or 10 volts. These input signals are then held fixed until the end of the cycle. The precharged nodes are pulsed from 0 volts to 10 volts within approximately 10 nanoseconds of $t = 0_+$. The data lines are left floating in potential by pulsing the reset A and B nodes from −5 volts to +5 volts. The data line reset pulse can occur at any time in the interval from 0 to 50 nanoseconds, but it is convenient to use the same timing as the precharge pulse because it is possible to drive the data line reset circuitry A and B from the precharge drive source using a capacitor for level shifting.

At T = 50 nanoseconds all but two of the 32 ASLs and all but one of the 32 DSLs are charged to +10 volts. The 2ASLs and the 1 DSL are charged to approximately +2 volts. Node CEA or CEB is then pulsed from +10 volts to +0 volts. This half charges the 32 DLs of the A or B array respectively. For a write cycle the appropriate I/O node is also pulsed from 0 to +10 volts.

At T = 100 nanoseconds, the selected access line has been discharged to 0 volts and charge stored in the memory cells of the selected access line has been transferred into the $C_D$s associated with respectively DLs. These data lines are therefore at −2 volts or at +2 volts. The LATCH node is now pulsed from 0 volts to +10 volts. The rise time of the voltage pulse is typically 50 nanoseconds. The +10 volts of CEA or CEB may now be lowered to 0 volts since either the write or the read refresh cycle has been completed. In any case, the +10 volts must be lowered to 0 volts at least 30 nanoseconds before the potential of the node is lowered to 0 volts.

At approximately T = 200 nanoseconds, the potentials applied to PRECH, LATCH, and Reset A and B, are returned to the original states occupied at T = 0.

Between T = 200 and 250 nanoseconds, new address information is applied to the address inputs and the cycle repeats.

The access time of the preferred embodiment of the 1,024 bit memory system is typically 150 nanoseconds and the cycle time is typically 250 nanoseconds. Each memory cell occupies only 4.9 square mils of semiconductor area. The design rules for adjacent metallizations utilized is 10 microns. If this is reduced to 5 microns the access time will be appropriately reduced to 50 nanoseconds and the cycle time will be reduced to approximately 100 nanoseconds.

The entire memory system 10 of FIG. 1 comprises basically only IGFETs and capacitors. The basic process for fabrication of the entire memory system is as follows:

A semiconductor wafer of 6–9 ohm centimeter n-type silicon having a [1,1,1] orientation is first cleaned using standard techniques, and then phosphorous is ion implanted into the entire top surface of the wafer to produce a region containing approximately $8\times10^{11}$ impurities cn$^{-2}$. This causes a relatively thin n+type layer to be formed within the n-type substrate. The n+type layer serves as a channel stop, which as is well known, prevents parasitic undesirable transistor action from occurring between adjacent transistors and other undesirable coupling effects. This channel stop is later compensated in those areas where it is not wanted. This technique of fabricating a channel stop and the resulting benefits over standard techniques is more fully explained in copending U.S. application Ser. No. 213,044 filed on Dec. 28, 1971, in which the present assignee is also the assignee.

The wafer is then cleaned using standard techniques and oxidized in steam at approximately 1,050° C for 80 minutes to form approximately 7,000 angstroms of $SiO_2$ on the surface of the wafer.

A fast etching layer is then created within the silicon dioxide layer $SiO_2$ by argon ion bombardment ($3\times10^{13}$ impurities cm$^{-2}$ at 50 kv). This insures that during subsequent etching through the $SiO_2$, for diffusions or metal contacts or ion implants, that a tapered wall of approximately 40°, instead of the regular essentially vertical wall, is formed. This 40° taper wall helps insure that metal which covers any steps in the oxide will be continuous over the step and limits the tendency of the metal to fracture at the step in the oxide. This technique is more fully described in copending application Ser. No. 245,503 filed on Apr. 19, 1972 in which the present assignee is also the assignee.

Next positive photoresist - AZ111 is applied to the entire surface of the wafer. Projection lithography is used where possible to reduce mask and silicon damage and to obtain resolution on the order of approximately 5 microns. The areas of the photoresist which have been exposed to light are removed using standard techniques and then exposed portions of the silicon layer are etched away down to the surface of the wafer.

The wafer is then cleaned and a boron ion implant of $1.2\times10^{-12}$ impurities cm$^{-2}$ is made in the gate region. This causes the implanted n+type layer to be converted back to n-type material in the selected areas. After another cleaning step, the exposed gate region of the substrate is oxidized in dry $O_2$ and HCl gas at 1,100° for approximately 32 minutes to give 1,000 angstroms $SiO_2$ over the gate region which is annealed in argon to 1,100° C for approximately 30 minutes.

A deposition of 3,500 angstroms of tungsten is then made over the entire surface of the wafer. Positive photoresist AZ111 is then applied over the tungsten and projection lithography is used to expose selected regions of the wafer. After the photoresist develops it can be easily removed thereby exposing the tungsten below. The aqueous ferricyanide solution containing a proton acceptor, such as phosphate buffer, with a basicity constant (see Acid Base Equilibria by E. J. King, Permagen Press, New York, 1965) between $10^{-2}$ and $10^{-10}$ is used to etch away the exposed tungsten. The concentration of ferricyanide is between 0.01 and 2M. The mole concentration of the proton acceptor should be between 0.1 and 100 times the concentration of the ferricyanide.

Tungsten metalization is used because of its good adhesive properties and its low reactivity even at elevated temperatures. Previous problems associated with etching tungsten thin films have been overcome through the use of the above mentioned etching solution, which is the subject of a copending United States patent application, Ser. No. 293,497 filed on Mar. 30, 1972, in which the present assignee is also the assignee.

After cleaning, boron ion implanation of $5\times10^{14}$ impurities cm$^{-2}$ at 50 kilovolts is used to form the sources and drains of the IGFETs. This ion bombardment does not go into the areas covered by the first level tungsten and is therefore self-aligning to the gates of the IGFETs.

Next using KMER and standard contact printing openings are made in the silicon dioxide for establishing electrical contact to the silicon substrate. A thin layer of aluminum (~100 angstroms) is then evaporated over the KMER to dissipate charge buildup in the subsequent ion implantation step. This step involves an ion implanting of $2\times10^{15}$ cm$^{-2}$ phosphorous at 40 kilovolts to establish substrate contact. The aluminum and KMER are then removed and a cleaning step is performed. Now 1$\mu$ of $SiO_2$ is deposited on the wafer at 900° C. The wafer is then inserted into a furnace containing $PBr_3$ (or $POCl_3$) at 1,000° C for 30 minutes. This process simultaneously getters any residual mobile ions (sodium) from the gate oxide, and getters heavy metal impurities which may result in unacceptably high junction leakage ( 500 nacm$^{-2}$ at 10 volts reverse bias at room temperature is desirable).

Surface phosphorous glass is removed and the wafer is cleaned and windows opened by standard photolithography (projection printing) and positive resist. These windows expose all appropriate first level tungsten, source and drain regions, and substrate contacts.

After appropriate cleaning, second level tungsten is deposited by sputtering, defined, and then appropriately etched as previously described for the first level tungsten.

After appropriate cleaning, the wafers are annealed in $H_2$ at 380° C and then 1,400 angstroms of $Si_3N_4$ is deposited at approximately 720° C as a seal, followed by the deposition of 1 micron of $SiO_2$ at approximately 475°, which serves as an etch mask for the nitride and gives mechanical protection to the surface of the wafer.

Using standard photolithography and positive photoresist, windows are opened within the silicon dioxide. The silicon dioxide then serves as a mask which allows the exposed silicon nitride to be etched away. The reason for the use of the silicon dioxide as a mask instead of photoresist is that the etchant used to remove silicon nitride attacks photoresist whether it has been exposed or not. Contact can now be made from the second metal level to the beam leads to be formed.

The nitride is etched in $H_3PO_4$ at 180° C for approximately 15 minutes. The wafer is then cleaned in an acid mixture of $HNO_3$-$H_2SO_4$ 1:1 at 110° C for 10 minutes, followed by $H_2O$:HF 100:1 for 30 seconds.

A mask, which contains openings corresponding to where beam leads are to be formed is first thoroughly cleaned and then aligned with the wafer such that the opening in the mask corresponds to the areas on the wafer in which beam leads are to be fabricated. This type of mask is generally denoted as a shadow mask.

Using evaporation techniques 750 angstroms of Ti and then 1,000 angstroms of Pd are deposited in the exposed areas of the wafer. The wafer is then annealed at 325° C in forming gas of 15 percent $H_2$ and 85 percent $N_2$ for 1 hour. This step improves the adherence between the dielectric, Ti and Pd layers, before the presence of thick gold imposes mechanical constraints upon the system.

The wafer is now mounted with a polypropylene plate to cover the entire backside of the wafer. This prevents the exposed silicon from dissolving in the solution used to electrolessly plate the beam leads with gold.

An electroless gold plate of 10–12 microns is now formed on each of the beam leads by placing the wafer with the polypropylene plate into a bath solution of .003M KAu $(CN)_2$, 0.1M KCN, 0.2KOH, and 0.2M $KBH_4$, operated at 75° C with vigorous stirring. Under these conditions, gold deposits about 6$\mu$m/hr. The method and composition of the depositing solution is illustrated in more detail in U.S. Pat. No. 3,700,469, issued on Oct. 24, 1972, in which the present assignee is also the assignee. The rotating substrate holder described in copending U.S. patent application Ser. No. 241,363, filed on Apr. 5, 1972 in which one of the co-inventors is co-inventor in this application, and in which the present assignee is also the assignee, may be utilized to form the 10–12 microns of gold plate of the beam leads.

Figure 9:
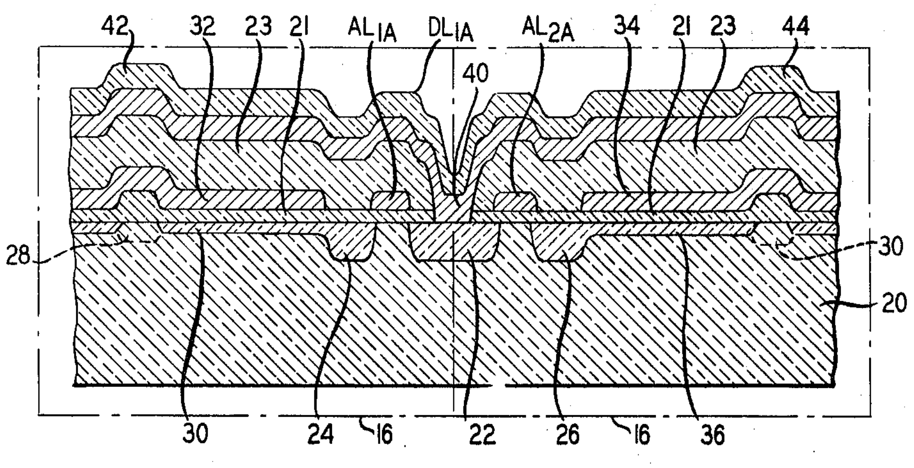
FIG. 9 illustrates a cross-sectional view of the preferred embodiment of two adjacent memory cells of FIG. 3.

FIG. 9 illustrates the cross-sectional view of the preferred embodiment of two vertically adjacent memory cells 16 which have been fabricated in a 6 to 9 ohm centimeter n-type substrate 20 using the basic process described above. The implanted drain 22, which is a p+type region, serves as a drain for both of the memory cells 16. P+type implanted regions 24 and 26 serves as the sources of the two respective memory cells 16. The n+type implanted regions 28 and 30 serve as channel stops which prevent parasitic transistor action. The approximately 1,000 angstrom layer 21 of $SiO_2$ under the tungsten metallization layers $AL_{1A}$ and $AL_{2A}$ is the gate insulator for the two IGFETs formed by the p+type regions 24 and 22 and 26 and 22. The tungsten metallic layers 32 and 34 each form one plate of storage capacitor $C_S$ of each of the memory cells 16. These metallic layers are held at 0 volts and the n-type Si substrate is held at +13 volts. This bias insures inversion layers 36 and 38 at the $SiO_2$-Si interface. The second plate of each of the $C_S$ is the inversion layer, which makes direct contact with the source of each of the IGFETs. The capacitance of the inversion layer is approximately 0.4pF and that of the formed depletion layer is approximately 0.1pF. This means $C_S$ is approximately 0.5pF.

The metal contact 40 to the drain 22 like that to the gate is also tungsten. The second level of tungsten metallization 42 which contacts the drains is separated from the first level by a layer 23 approximately 8,000 angstroms of $SiO_2$. A layer of silicon nitride 44 on top of the two tungsten metallization layers serves to pacify the entire wafer.

It is to be understood that the embodiments described are merely illustrative of the general principles of the invention. Various modifications are possible within the spirit of the invention. For example, n-channel IGFETs may be substituted for the p-channel providing the voltage pulse supply and input potentials were adjusted appropriately.

What is claimed is:

1. An inverter circuit comprising:
first, second, third, and fourth field effect transistors;
the drain of the first transistor being coupled to the source of the second transistor;
a first terminal being coupled to the gate of the first transistor and a second terminal being coupled to the drain of the first transistor;
the gate of the second transistor being coupled to the source of the third transistor and the drain of the fourth transistor;
the drain of the second transistor being coupled to the gate of the fourth transistor;
a third terminal being coupled to the drain of the second transistor;
the gate and drain of the third transistor being coupled together;
a fourth terminal being coupled to the drain of the third transistor;
a fifth terminal being coupled to the source of the first transistor;
the second transistor being characterized by a first capacitance coupling the circuit path between the drain and gate and a second capacitance coupling the circuit path between the gate and source; and
a third capacitance coupled to the gate of the second transistor.

2. The apparatus of claim 1 wherein the source of the fourth transistor is coupled to the drain of the first transistor.

3. The apparatus of claim 2 wherein the four field effect transistors are p-channel insulated gate field effect transistors.

4. The apparatus of claim 3 further comprising a first voltage pulse circuit coupled to the third terminal and a second voltage pulse circuit coupled to the fourth terminal.

5. The apparatus of claim 1 further comprising a fifth transistor, the gate of the fifth transistor being coupled to the gate of the first transistor and the drain of the fifth transistor being coupled to the source of the fourth transistor.

6. The apparatus of claim 5 wherein the five transistors are all p-channel insulated gate field effect transistors.

7. The apparatus of claim 5 further comprising a first voltage pulse circuit coupled to the third terminal.

8. A semiconductor inverter circuit comprising:
first, second, third, and fourth field effect transistors,
the drain of the first transistor being coupled to the source of the second transistor;
the gate of the second transistor being coupled to the source of the third transistor and the drain of the fourth transistor;
the gate and drain of the third transistor being coupled together;

the source of the fourth transistor being coupled to the drain of the first transistor;

a first capacitance coupling together the drain and gate of the second transistor;

a second capacitance coupling together the source and gate of the second transistor;

a third capacitance coupled to the gate of the second transistor; and the gate of the fourth transistor being coupled to the drain of the second transistor.

9. A semiconductor inverter circuit comprising:

first, second, third, fourth, and fifth field effect transistors;

the drain of the first transistor being coupled to the source of the second transistor;

the gate of the second transistor being coupled to the source of the third transistor and the drain of the fourth transistor;

the gate and drain of the third transistor being coupled together;

the source of the fourth transistor being coupled to the drain of the fifth transistor;

the gate of the fifth transistor being coupled to the gate of the first transistor;

the circuit path between the drain and gate of the second transistor being characterized by a first capacitance; and the circuit path between the source and gate of the second transistor being characterized by a second capacitance; and the gate of the fourth transistor being coupled to the drain of the second transistor.

10. An inverter circuit comprising:

first and second field effect transistors, the drain of the first transistor being coupled to the source of the second transistor;

voltage bias circuit means comprising first and second terminals;

a third field effect transistor, the gate of the second transistor being coupled to the drain of the third transistor and to the first terminal of the voltage bias means;

the circuit path between the drain and the gate of the second transistor being defined by a first capacitance;

the circuit path between the source and gate of the second transistor being defined by a second capacitance;

a third capacitance being coupled to the gate of the second transistor; and the gate of the third transistor being coupled to the drain of the second transistor.

11. A logic circuit comprising:

first switching means comprising first and second terminals and a control terminal for selectively establishing an essentially short circuit or open circuit condition between the first and second terminals thereof;

a field effect transistor having source, drain, and gate terminals, the source terminal being coupled to the second terminal of the first switching means;

first capacitive circuit means coupling together the drain and gate terminals of the transistor and second capacitive circuit means coupling together the source and gate terminals of the transistor;

voltage biasing means coupled to the gate terminal of the transistor; and second switching means comprising first and second terminals and a control terminal for selectively establishing an essentially short or open circuit condition between the first and second terminals thereof, the gate and the drain of the transistor being coupled to the second and control terminal of the second switching means, respectively.

12. The apparatus of claim 11 wherein the first terminal of the second switching means is coupled to the source of the transistor.

13. The apparatus of claim 11 further comprising:

a third switching means comprising a control terminal and first and second terminals for selectively establishing an essential short circuit and an open circuit condition between the first and second terminals thereof, the control terminal of the third switching means being coupled to the control terminal of the first switching means, the second terminal of the third switching means being coupled to the first terminal of the second switching means.

* * * * *

UNITED STATES PATENT OFFICE

CERTIFICATE OF CORRECTION

PATENT NO. : 3,825,771

DATED : July 23, 1974

INVENTOR(S) : Harry J. Boll

It is certified that error appears in the above-identified patent and that said Letters Patent are hereby corrected as shown below:

Patent Office Errors

On first page of patent above the Abstract and next to "Attorney Agent, or Firm", "H. Christoffersen; Henry I. Schanzer" should read --I. Ostroff; R. B. Anderson--. Column 2, line 23, "raise" should read --rise--; line 51, "circuit" should read --circuitry--; line 53, "circuit" should read --circuitry--. Column 5, line 56, "$Q_4$" should read --$Q'_4$--. Column 6, line 46, "data to" should read --to data--. Column 7, line 19, delete parenthesis. Column 9, line 13, "supplied" should read --applied--; line 41, "since" should read --Since--; line 64, "3" should read --30--; line 66, after "appropriate" insert --data--. Column 10, line 22, "line" should read --lines--. Column 11, line 5, "+5" should read -- -5--; line 49, insert parenthesis before "$AL_{1A}$, $DL_{2A}$)". Column 12, line 12, "$DL_{32A}$" should read --$DL_{1B}$--, "arra" should read --array--; line 57, before "node" insert --LATCH--. Column 13, line 59, "to" should read --at--. Column 14, line 10, before "low" insert --relatively--; line 15, "293,497" should read --239,497--; line 38, before "500" insert< -- --. Column 15, line 25, "0.2KOH" should read --0.2M KOH--. Column 17, line 27, after "capacitance;" delete "and".

UNITED STATES PATENT OFFICE

CERTIFICATE OF CORRECTION

PATENT NO. : 3,825,771

DATED : July 23, 1974

INVENTOR(S) : Harry J. Boll

It is certified that error appears in the above-identified patent and that said Letters Patent are hereby corrected as shown below:

Applicant's Errors

In the Abstract, line 6, "diver" should read --driver--. Column 3, line 21, "hold" should read --holds--. Column 4, line 42, "reach" should read --reaches--. Column 5, line 5, "FIG. 1'" should read --FIG. 1--; line 36, "a +10 volts" should read --at +10 volts--; line 51, "form" should read --from--; line 54, "than" should read --then--; line 58, "parasictic" should read --parasitic--; lines 66-67, "dissipatance" should read --dissipation--; last line, "dive" should read --drive--. Column 6, lines 10-11, "recover" should read --recovery--.

Signed and Sealed this

*twenty-ninth* Day of *July 1975*

[SEAL]

*Attest:*

RUTH C. MASON
*Attesting Officer*

C. MARSHALL DANN
*Commissioner of Patents and Trademarks*